US008120946B2

(12) United States Patent
Kanakasabapathy et al.

(10) Patent No.: US 8,120,946 B2
(45) Date of Patent: Feb. 21, 2012

(54) STACKED MAGNETIC DEVICES

(75) Inventors: Sivananda Kanakasabapathy, Hopewell Junction, NY (US); Yu Lu, Hopewell Junction, NY (US); Michael Christopher Gaidis, III, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/504,860

(22) Filed: Jul. 17, 2009

(65) Prior Publication Data

US 2009/0279354 A1    Nov. 12, 2009

Related U.S. Application Data

(63) Continuation of application No. 10/977,792, filed on Oct. 29, 2004, now abandoned.

(51) Int. Cl.
*G11C 11/00* (2006.01)
(52) U.S. Cl. ........................................................ 365/158
(58) Field of Classification Search .................. 365/158, 365/171
See application file for complete search history.

(56) References Cited

U.S. PATENT DOCUMENTS

| | | | | |
|---|---|---|---|---|
| 5,640,343 | A | 6/1997 | Gallagher et al. | 365/171 |
| 6,545,906 | B1 | 4/2003 | Savtchenko et al. | 365/158 |
| 6,603,677 | B2 | 8/2003 | Redib et al. | 365/158 |
| 6,937,497 | B1 | 8/2005 | Ju et al. | 365/130 |
| 6,956,763 | B2 | 10/2005 | Akerman et al. | 365/158 |
| 6,956,764 | B2 * | 10/2005 | Engel et al. | 365/158 |
| 6,970,376 | B1 | 11/2005 | Fukuzumi | 365/158 |
| 2003/0161180 | A1 * | 8/2003 | Bloomquist et al. | 365/173 |
| 2005/0199927 | A1 * | 9/2005 | Lu | 257/295 |
| 2005/0232006 | A1 | 10/2005 | Iwata | 365/171 |

OTHER PUBLICATIONS

Durlam et al., "A 0.18 um 4Mbit Toggling MRAM," IEEE International Conference on Integrated Circuit Design and Technology, pp. 27-30 (2004).
Engel et al., "The Science and Technology of Magnetoresistive Tunneling Memory," IEEE Transaction on Nanotechnology. vol. 1, No. 1, pp. 32-38 (Mar. 2002).
Sitaram et al., "A 0.18 um Logic-Based MRAM Technology for High Performance Nonvolatile Memory Applications," Symposium on VLSI Technology Digest of Technical Papers, pp. 15-16 (2003).
Tehrani et al., "Magnetorisistive Random Access Memory Using Magnetic Tunnel Junctions," Proceedings of the IEEE. vol. 91, No. 5, pp. 703-714 (2003).
Worledge, D.C., "Spin Flop Switching for Magnetic Random Access memory," Applied Physics Letters, American Institute of Physics, vol. 84, No. 22, pp. 4559-4561 (May 31, 2004).
Reohr et al., "Memories of Tomorrow," IEEE Circuits & Devices Magazine, pp. 17-27 (Sep. 2002).

* cited by examiner

*Primary Examiner* — Hoai V Ho
*Assistant Examiner* — Anthan Tran
(74) *Attorney, Agent, or Firm* — Ryan, Mason & Lewis, LLP

(57) ABSTRACT

Techniques for improving magnetic device performance are provided. In one aspect, a magnetic device, e.g., a magnetic random access memory device, is provided which comprises a plurality of current carrying lines; and two or more adjacent stacked magnetic toggling devices sharing at least one of the plurality of current carrying lines in common and positioned therebetween. The magnetic device is configured such that at least one of the adjacent magnetic toggling devices toggles mutually exclusively of another of the adjacent magnetic toggling devices. In an exemplary embodiment, the magnetic device comprises a plurality of levels with each of the adjacent stacked magnetic toggling devices residing in a different level.

22 Claims, 8 Drawing Sheets

1100

STACKED MAGNETIC DEVICES

CROSS-REFERENCE TO RELATED APPLICATIONS

This application is a continuation of U.S. patent application Ser. No. 10/977,792, filed Oct. 29, 2004, incorporated by reference herein.

FIELD OF THE INVENTION

The present invention relates to techniques for improving magnetic device performance and, more particularly, to improved magnetic device structures and methods for use thereof

BACKGROUND OF THE INVENTION

Magnetic devices, such as magnetic random access memories (MRAM), commonly employ a plurality of magnetic tunnel junction (MTJ) devices to store information, each MTJ device comprising one or more magnetic films, or layers. Typically, one of these magnetic layers is a pinned magnetic layer and another of these magnetic layers is a free magnetic layer.

Information is stored in such MTJs as an orientation of the magnetization of the free magnetic layer as compared to an orientation of the magnetization of the pinned magnetic layer. Namely, whereas the pinned magnetic layer has an orientation of magnetization that is fixed, e.g., by a variety of techniques, the free magnetic layer has an orientation of magnetization that is programmed to be either parallel or anti-parallel to that of the pinned magnetic layer, e.g., during a "WRITE" operation of the device.

The free magnetic layer and the pinned magnetic layer typically have a tunnel barrier therebetween. The resistance of this tunnel barrier depends on the orientation of the magnetization of the free magnetic layer relative to the orientation of the magnetization of the pinned magnetic layer. Namely, the resistance of the magnetic tunnel junction is higher when the free magnetic layer and the pinned magnetic layer have orientations of magnetizations that are anti-parallel, as compared to when they are parallel. If the anti-parallel and parallel magnetization states of the magnetic layers are coded to represent binary bits, the state of the magnetic tunnel junction, e.g., either a logic "1" or a "0," is detected in the "READ" operation by measuring the resistance of the MTJ.

The orientation of the magnetization of a given layer (pinned or free) may be represented by an arrow which, by way of example only, can in some configurations be represented as pointing either to the left or to the right. When the MTJ is sitting in a zero applied magnetic field, the magnetization of the MTJ is stable, pointing either left or right. The application of a magnetic field, however, can toggle the magnetization of the free layer from left to right, and vice versa, to write information to the MTJ. One of the important requirements for data storage is that the magnetization of the MTJ not change orientation unintentionally during the writing process or when there is a zero applied field, or only a small applied field.

However, in many conventional MTJs, the free magnetic layer is typically composed of a single magnetic layer, which can possess a net magnetic dipole moment. The net magnetic dipole moment can undesirably cause a dipole field outside of the MTJ that interferes with the write operation of neighboring MTJs. In addition, this net external dipole field couples strongly to applied fields used to "WRITE" neighboring MTJs and can cause additional MTJs to switch undesirably.

For example, U.S. Patent Application Number US2003/0161180 by Bloomquist et al., entitled "Shared Bit Lines In Stacked MRAM Arrays," (hereinafter "Bloomquist"), the disclosure of which is incorporated by reference herein, discloses cross-point arrays which include stacked magnetic storage elements, each element comprising a single-layer free magnetic layer. Such cross-point arrays have several notable disadvantages. As mentioned above, a dipole field may undesirably be generated outside of a given MTJ that interferes with the write operations of neighboring MTJs. As such, device density must be greatly reduced, by increasing the separation between adjacent devices, to compensate for this effect. Further, cross-point arrays undesirably generate parasitic current paths, which are competing paths for each given magnetic toggling device. These parasitic paths reduce signal strength during the READ operation. A reduced signal requires that signal averaging be done to read the logical states of the memory cells. As such, inaccuracies and loss of speed surely result.

Therefore, techniques for increasing the density of MTJs in magnetic devices while at the same time decreasing error rates, e.g., in the WRITE operation, would be desirable.

SUMMARY OF THE INVENTION

The present invention provides techniques for improving magnetic device performance. In one aspect of the invention, a magnetic device, e.g., a magnetic random access memory device, is provided which comprises a plurality of current carrying lines; and two or more adjacent stacked magnetic toggling devices sharing at least one of the plurality of current carrying lines in common and positioned therebetween. The magnetic device is configured such that at least one of the adjacent magnetic toggling devices toggles mutually exclusively of another of the adjacent magnetic toggling devices. In an exemplary embodiment, the magnetic device comprises a plurality of levels with each of the adjacent stacked magnetic toggling devices residing in a different level.

A more complete understanding of the present invention, as well as further features and advantages of the present invention, will be obtained by reference to the following detailed description and drawings.

DETAILED DESCRIPTION OF PREFERRED EMBODIMENTS

Figure 1:
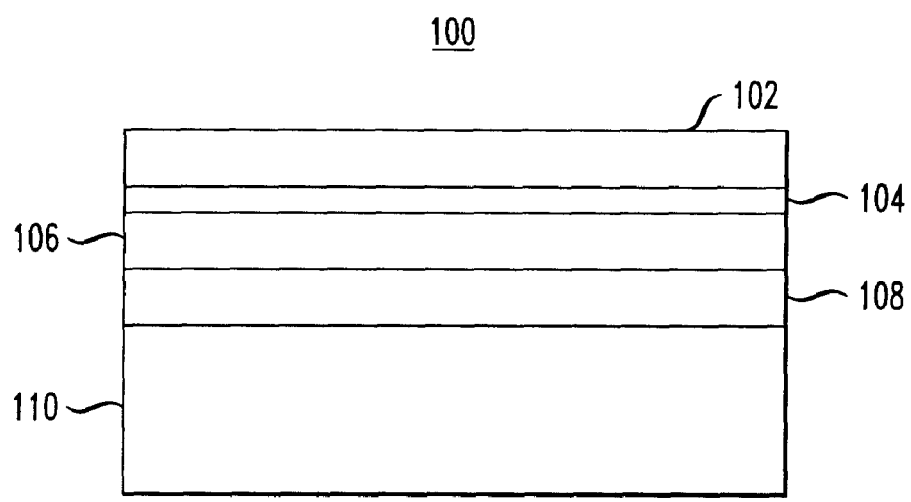
FIG. 1 is a diagram illustrating an exemplary magnetic toggling device according to an embodiment of the present invention.

FIG. 1 is a diagram illustrating an exemplary magnetic toggling device, e.g., magnetic toggling device 100. In an exemplary embodiment, magnetic toggling device 100 comprises a magnetic tunnel junction. As will be described in detail below, the term "toggle" refers to the fact that a free layer of magnetic toggling device 100 comprises at least two loosely anti-parallel coupled magnetic layers. Magnetic toggling device 100 comprises magnetic layers 102 and 106 (separated by non-magnetic spacer layer 104), barrier layer 108 and magnetic layer 110. In an exemplary embodiment, magnetic layers 102 and 106 separated by non-magnetic spacer layer 104 comprise a free layer of magnetic toggling device 100, and magnetic layer 110 comprises a pinned layer of magnetic toggling device 100. Magnetic layer 102, magnetic layer 106 or both magnetic layers 102 and 106 may comprise a ferromagnetic material.

Non-magnetic spacer layer 104 may be configured to have a composition and a thickness suitable for loosely anti-parallel coupling magnetic layers 102 and 106. For example, in an exemplary embodiment, non-magnetic spacer layer 104 comprises ruthenium and has a thickness of from about 50 angstroms to about 60 angstroms. As mentioned above, magnetic toggling devices having a free layer comprising at least two loosely anti-parallel coupled, e.g., ferromagnetic, layers will be referred to herein as magnetic toggling devices.

U.S. Pat. No. 5,640,343 issued to Gallagher et al., entitled "Magnetic Memory Array Using Magnetic Tunnel Junction Devices in the Memory Cells," the disclosure of which is incorporated by reference herein, describes an array of MTJs, each MTJ being uniquely addressed by two wires that intersect over the corresponding MTJ. Several technology demonstrators (e.g., experimental embodiment for understanding the parameters of a technology) have been accomplished embodying this principle. See, for example, W. Reohr et al., *Memories of Tomorrow*, IEEE CIRCUITS & DEVICES MAGAZINE, pgs. 17-27 (September 2002); S. Tehrani et al., *Magnetoresistive Random Access Memory Using Magnetic Tunnel Junctions*, PROC. OF THE IEEE, Vol. 91, No. 5, pgs. 703-714 (May 2003); B. N. Engel et al., *The Science and Technology of Magnetoresistive Tunneling Memory*, IEEE TRANS. ON NANOTECH., Vol. 1, No. 1, pgs. 32-38 (March 2002); and A. R. Sitaram et al., *A 0.18 μm Logic-Based MRAM Technology for High Performance Nonvolatile Memory Applications*, PROC. OF THE VLSI SYMPOSIUM (2003), the disclosures of which are incorporated by reference herein.

U.S. Pat. No. 6,545,906 issued to Savtchenko et al., entitled "Method of Writing to Scalable Magnetoresistance Random Access Memory Element," (hereinafter "Savtchenko"), the disclosure of which is incorporated by reference herein, describes an MTJ having a free magnetic layer comprising two loosely anti-parallel coupled ferromagnetic films with a non-magnetic spacer layer therebetween. Savtchenko teaches that the balance between two loosely anti-parallel coupled free magnetic layers can be perturbed by an external magnetic field to produce a net transient moment. The techniques described in Savtchenko help avoid the unintentional toggling of half-selected MTJs. See, for example, D. C. Worledge, *Spin Flop Switching for Magnetic Random Access Memory*, APPLIED PHYS. LETTERS, Vol. 84, Number 22, pgs. 4559-4561 (2004) and M. Durlam et al., *A 0.8 μm 4 Mbit Toggling MRAM*, PROC. OF IEEE IEDM, pgs. 27-30 (2004) (which describes a magnetic random access memory (MRAM) array constructed on such MTJs with loosely anti-parallel coupled free magnetic layers), the disclosures of which are incorporated by reference herein.

Figure 2:
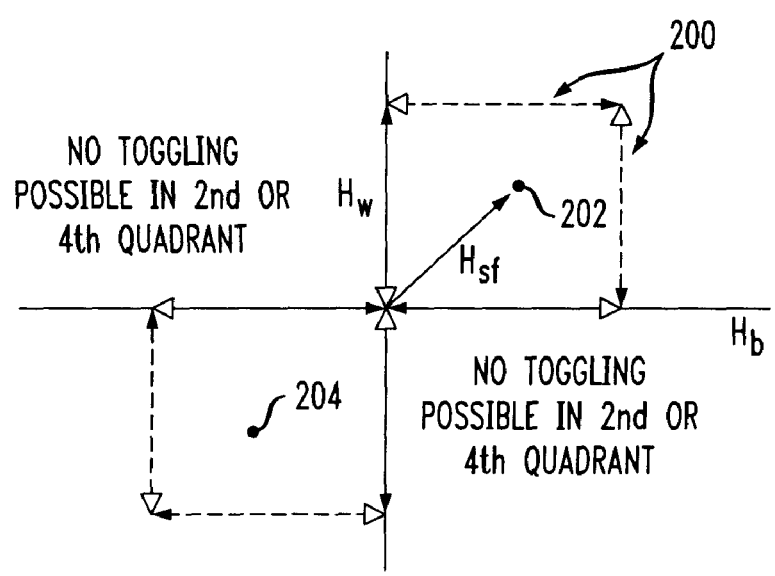
FIG. 2 is a graph illustrating magnetic field trajectories for toggling a magnetic toggling device according to an embodiment of the present invention.

FIG. 2 is a graph illustrating magnetic field trajectories for toggling a magnetic toggling device. As shown in FIG. 2, only certain combinations of magnetic fields $H_b$ and $H_w$ generated by the current carrying bit line (x-axis) and word line (y-axis), respectively, will toggle the magnetic toggling device. For example, a positive $H_w$ and a positive $H_b$ will result in toggling of the device, as long as trajectory 200, of the magnetic field, circumnavigates the spin flop point ($H_{sf}$), e.g., spin flop point 202 in the first quadrant. Similarly, a negative $H_w$ and a negative $H_b$ will also toggle the device as long as the trajectory circumnavigates spin flop point 204 in the fourth quadrant. However, having either a positive $H_w$ in combination with a negative $H_b$, or vice versa, will not result in toggling of the device. As indicated in the graph, no toggling is possible in the second or fourth quadrants, since there exist no spin-flop points in those quadrants. Thus, only two quadrants of the toggling field, e.g., the first and the third, are utilized. This unique property of toggle magnetic memory devices, as will be described in detail below, is exploited in the present techniques to attain toggling selectively in one level without toggling in another level. The concept of toggle magnetic memory devices residing in distinct levels within a magnetic device will be described in detail below, e.g., in conjunction with the description of FIG. 5.

Figure 3:
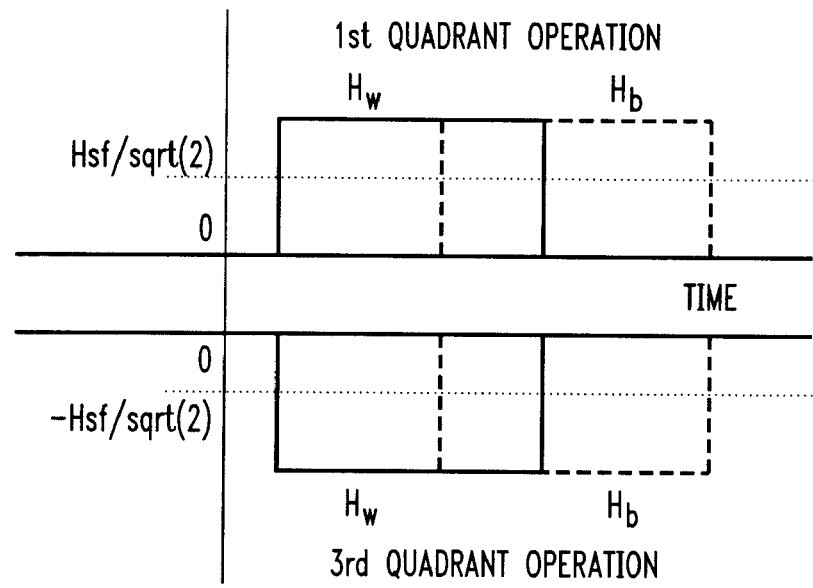
FIG. 3 is a graph illustrating time domain sequencing of magnetic fields that will result in the toggling of a magnetic toggling device according to an embodiment of the present invention.

FIG. 3 is a graph illustrating time domain sequencing of magnetic fields that will result in the toggling of a magnetic toggling device. Namely, as was described, for example in conjunction with the description of FIG. 2, above, the combinations of both a positive $H_w$ and a positive $H_b$ or both a negative $H_w$ and a negative $H_b$ will result in toggling of the device.

The graph in FIG. 3 further illustrates that a temporal overlap of toggling currents in the time domain toggles a magnetic toggling device. Namely, as illustrated in the upper section of the graph (labeled "$1^{st}$ Quadrant Operation"), a positive $H_w$ is first employed, followed in time by a positive $H_b$. $H_w$ is then switched off followed by $H_b$ being switched off. As mentioned, for example in conjunction with the description of FIG. 2, above, as long as the applied field circumnavigates the spin flop point, the combination of fields will toggle the device. Similarly illustrated in the lower section of the graph (labeled "$3^{rd}$ Quadrant Operation"), a negative $H_w$ is first employed, followed in time by a negative $H_b$. $H_w$ is then switched off followed by $H_b$ being switched off. The device is toggled. Further, it is important to note that, while $H_w$ is shown as being employed first, followed by $H_b$ being employed, $H_w$ and $H_b$ are interchangeable regarding which field is employed first. Namely, the chirality (e.g., clockwise versus anti-clockwise) of circulation of the spin-flop point does not affect the toggling of the device. Therefore, in an exemplary embodiment, $H_b$ is employed first, followed by $H_w$ being employed.

According to another exemplary embodiment, a positive $H_w$ is first employed which generates a transient net moment, followed in time by a positive $H_b$ which toggles the magnetic toggling device by exploiting the transient net moment. Upon removal of both fields, balance is restored between the two magnetic layers making up the free layer and the transient net moment vanishes.

Figure 4:
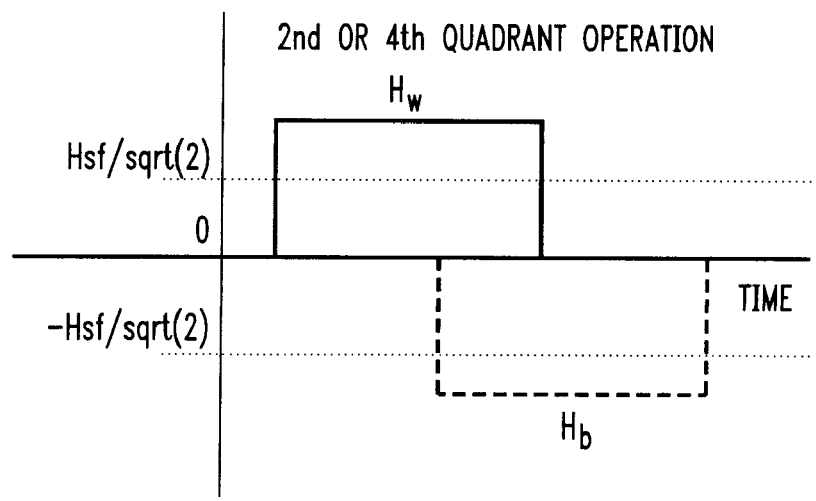
FIG. 4 is a graph illustrating time domain sequencing of magnetic fields that will not result in the toggling of a magnetic toggling device according to an embodiment of the present invention.

FIG. 4 is a graph illustrating time domain sequencing of magnetic fields that will not result in the toggling of a magnetic toggling device. As was described, for example in conjunction with the description of FIG. 2, above, the combination of a positive $H_w$ and a negative $H_b$, or vice versa, will not result in the toggling of the device. Thus, in contrast to the graph shown illustrated in FIG. 3, the graph in FIG. 4 (labeled "$2^{nd}$ or $4^{th}$ Quadrant Operation") illustrates that, for example, first employing a positive $H_w$ followed in time by a negative $H_b$, then first switching off $H_w$ followed by $H_b$ being switched off will not result in toggling of the device.

Figure 5:
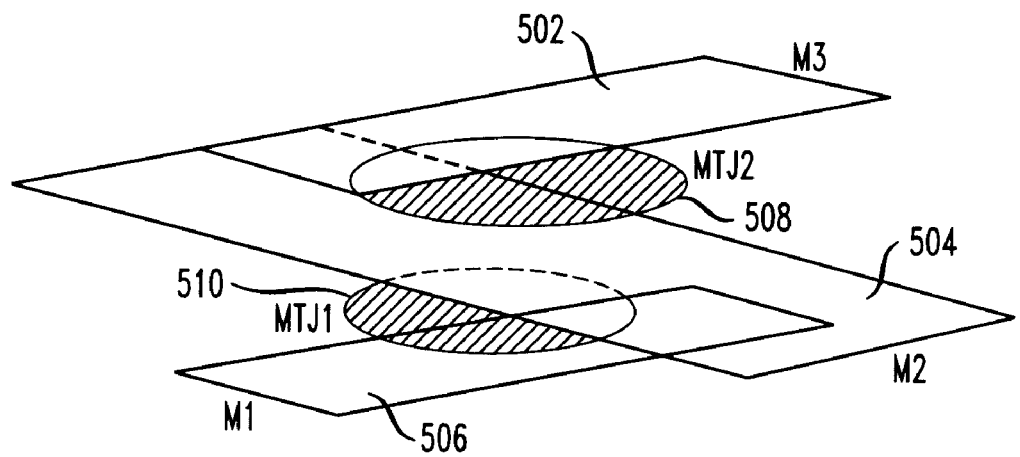
FIG. 5 is a diagram illustrating an exemplary magnetic device configuration having adjacent stacked magnetic toggling devices according to an embodiment of the present invention.

FIG. 5 is a diagram illustrating an exemplary magnetic device configuration having adjacent stacked magnetic toggling devices. As used herein, the term "stacked" refers to at least a portion of at least one side of, e.g., a magnetic toggling device, overlapping at least a portion of at least one side of another, e.g., magnetic toggling device. As shown in FIG. 5, exemplary magnetic device 500 comprises current carrying line 502 (labeled "M3"), current carrying line 504 (labeled "M2") and current carrying line 506 (labeled "M1"), with magnetic toggling device 508 (labeled "MTJ2") between current carrying lines 502 and 504, and magnetic toggling device 510 (labeled "MTJ1") between current carrying lines 504 and 506. According to an exemplary embodiment, each magnetic toggling device resides within a distinct level in the magnetic device, e.g., within a distinct magnetic toggling device level. For example, magnetic toggling device 508 resides in one level of magnetic device 500 and magnetic toggling device 510 resides in another, different, level of magnetic device 500. The levels of magnetic device 500 are distinguishable from one another by one or more of the current carrying lines. Each level of magnetic device 500 may comprise one or more magnetic toggling devices. Further, magnetic device 500 may be employed as part of a magnetic random access memory (MRAM) device.

As further shown in FIG. 5, current carrying line 502 is oriented substantially orthogonal to current carrying line 504. In turn, current carrying line 504 is oriented substantially orthogonal to current carrying line 506. Alternative arrangements of the current carrying lines are similarly contemplated. Magnetic toggling device 508 and magnetic toggling device 510 are stacked in relation to one another such that they share current carrying line 504 positioned therebetween. Further, magnetic toggling device 508 and magnetic toggling device 510 are oriented to have anisotropies aligned with each other, in the same direction. The anisotropy of a magnetic toggling device will be described in detail, for example, in conjunction with the description of FIG. 6, below.

Figure 6:
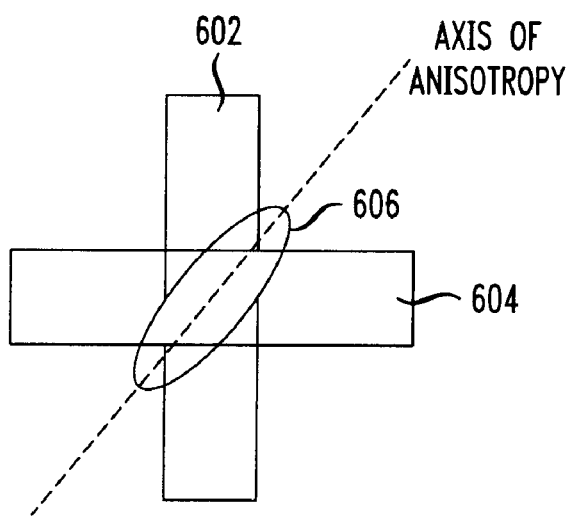
FIG. 6 is a top-down view diagram illustrating the axis of anisotropy of a magnetic toggling device present between two current carrying lines according to an embodiment of the present invention.

FIG. 6 is a top-down view diagram illustrating the axis of anisotropy of a magnetic toggling device present between two current carrying lines. Namely, in FIG. 6, magnetic toggling device 606 is shown sandwiched vertically between two current carrying lines 602 and 604. While one magnetic toggling device is shown in FIG. 6, as described above, if more than one magnetic toggling device is present, e.g., as in a stack, they would have anisotropies aligned with each other. FIG. 6 illustrates that when a magnetic toggling device, e.g., magnetic toggling device 606, is positioned to have an axis of anisotropy, e.g., as represented by the dotted line, that bisects the angle subtended between orthogonally oriented current carrying lines, e.g., bit and word lines such as current carrying lines 602 and 604, respectively, there exists a point in the first and third quadrants in the $H_w$ and $H_b$ space which, as was described above, is the spin-flop point. For example, as described in conjunction with the description of FIG. 2 above, as long as the applied field circumnavigates this spin flop point, the device will be toggled. There exists no spin-flop point in the second and fourth quadrants and thus any trajectories that exist solely in those two quadrants will not toggle the device.

Figure 7:
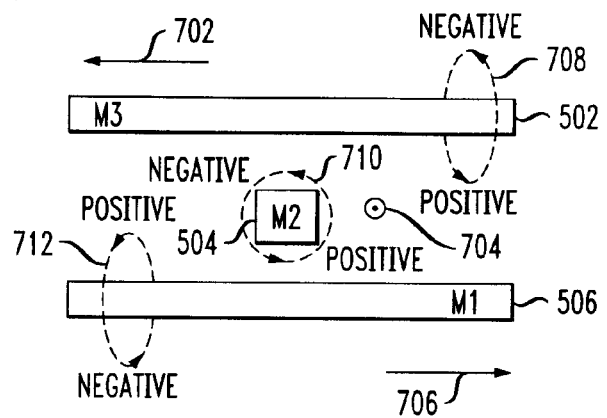
FIG. 7 is a diagram illustrating the polarity of orthogonally oriented current carrying lines according to an embodiment of the present invention.

FIG. 7 is a diagram illustrating the polarity of orthogonally oriented current carrying lines. Namely, FIG. 7 provides a cross-sectional view of magnetic device 500, described, for example, in conjunction with the description of FIG. 5, above, with magnetic toggling devices 508 and 510 removed for clarity. FIG. 7 illustrates the reversal of polarity of the magnetic field between two opposing sides of a current carrying conductor, e.g., a current carrying line.

The diagram in FIG. 7 illustrates an important property of magnetic fields generated by current carrying lines. Namely, in accordance with the well-known right-hand rule, the magnetic field produced circulates the current carrying lines. For example, as shown in FIG. 7, passing currents in the direction of 702, 704 and 706 produces magnetic field patterns 708 ($H_3$), 710 ($H_2$) and 712 ($H_1$), respectively. Further, if one were to deem the polarity of the magnetic field on one side of a given current carrying line to be positive, the same magnetic field on the other side of that line points in the opposite direction and hence would be negative by convention. For example, with regard to magnetic field pattern 708, if the magnetic field produced on the side of current carrying line 502 facing current carrying line 504 is deemed to be positive, then the magnetic field produced on the side of current carrying line 502 opposite current carrying line 504 is by convention negative. Further, in this exemplary embodiment, with regard to magnetic field pattern 710, the magnetic field produced on the side of current carrying line 504 facing current carrying line 502 is negative, whereas the magnetic field produced on the side of current carrying line 504 facing current carrying line 506 is positive. Similarly, with regard to magnetic field pattern 712, the magnetic field produced on the side of current carrying line 506 facing current carrying line 504 is positive, whereas the magnetic field produced on the side of current carrying line 506 opposite current carrying line 504 is negative.

Figure 8:
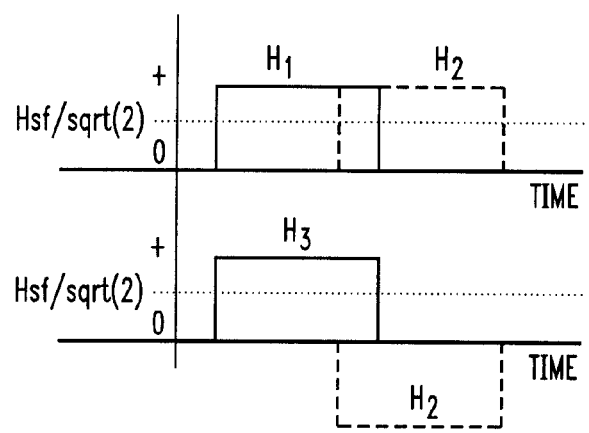
FIG. 8 is a graph illustrating time domain sequencing of magnetic fields used to mutually exclusively toggle one of two adjacent stacked magnetic toggling devices sharing a current carrying line positioned therebetween according to an embodiment of the present invention.

FIG. 8 is a graph illustrating time domain sequencing of magnetic fields used to mutually exclusively toggle one of two adjacent stacked magnetic toggling devices sharing a current carrying line positioned therebetween. For example, with reference to exemplary magnetic device 500, described, for example, in conjunction with the description of FIGS. 5 and 7, above, FIG. 8 is a graph illustrating the time domain sequencing of the magnetic fields used to toggle magnetic toggling devices 508 and 510 of magnetic device 500. Namely, the time domain sequencing of magnetic fields $H_1$ and $H_2$ are used to toggle magnetic toggling device 510, while the time domain sequencing of magnetic fields $H_3$ and $H_2$ are used to toggle magnetic toggling device 508 (magnetic fields $H_1$, $H_2$ and $H_3$ being the magnetic fields experienced by the respective one of magnetic toggling device 508 and/or magnetic toggling device 510).

Therefore, if the time domain sequencing of magnetic fields as shown illustrated in FIG. 8 were applied, e.g., by passing currents in the direction of 704 and 706 through current carrying lines 504 and 506, respectively, to generate corresponding magnetic fields $H_2$ and $H_1$, the field trajectory experienced by magnetic toggling device 510 is in the first quadrant. If the magnetic fields, e.g., magnetic fields $H_2$ and $H_1$, are of sufficient strength, the trajectory of the applied field can circumnavigate the spin flop point and toggle magnetic toggling device 510.

Importantly, magnetic toggling device 508 experiences the same polarity of magnetic field $H_1$ but the opposite polarity of magnetic field $H_2$ when compared with magnetic toggling device 510. Further, while magnetic toggling device 508 experiences the same polarity of magnetic field $H_1$ as magnetic toggling device 510, it is of a weaker magnitude due to increased spatial separation of magnetic toggling device 508 from current carrying line 506, e.g., as compared to the close proximity of magnetic toggling device 510 and current carrying line 506. Also, the magnetic field $H_2$ experienced by magnetic toggling device 508, the polarity of which being opposite to that experienced by magnetic toggling device 510, is of a comparable magnitude since magnetic toggling device 508 is positioned a similar distance to, but on the opposite side of, current carrying line 504.

Therefore, the magnetic field trajectory traced by magnetic fields $H_1$ and $H_2$ uniquely lies in the fourth quadrant as experienced by magnetic toggling device 508. Magnetic fields $H_1$ and $H_2$ thus will not toggle magnetic toggling device 508. As such, the present techniques allow for mutually non-interfering addressability of adjacent stacked magnetic toggling devices.

By a similar argument one can also prove that the time domain sequencing of magnetic fields $H_2$ and $H_3$, as shown in FIG. 8, can be used to uniquely toggle magnetic toggling device 508 mutually exclusively of magnetic toggling device 510 (e.g., without toggling magnetic toggling device 510).

Therefore, the magnetic field sequence generated by a pair of orthogonally oriented current carrying lines that each belong to two immediately adjacent wiring levels in a stacked magnetic toggling device array can be operated to uniquely address only the magnetic toggling devices sandwiched between them and not any other magnetic toggling devices, as long as the magnetic toggling devices are designed to have substantially parallel axes of anisotropy.

Figure 9:
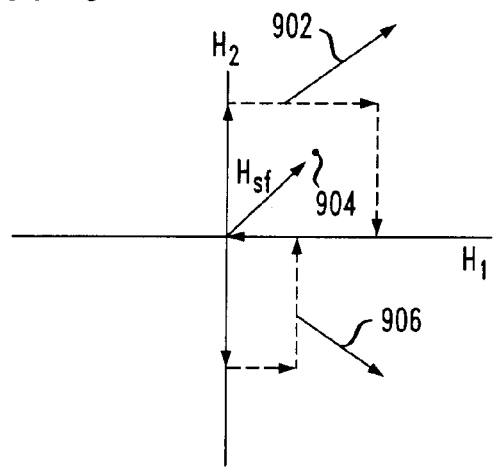
FIG. 9 is a graph illustrating magnetic field trajectories for mutually exclusively toggling one of two magnetic toggling devices sharing a current carrying line positioned therebetween according to an embodiment of the present invention.

FIG. 9 is a graph illustrating magnetic field trajectories for mutually exclusively toggling one of two magnetic toggling devices sharing a current carrying line positioned therebetween. For example, with reference to the time domain sequencing of magnetic fields used to toggle magnetic toggling devices 508 and 510 of magnetic device 500, described, for example, in conjunction with the description of FIG. 8 above, FIG. 9 illustrates the magnetic fields experienced by magnetic toggling devices 508 and 510. Namely, FIG. 9 confirms that the time domain sequencing of magnetic fields $H_1$ and $H_2$ will result in toggling of magnetic toggling device 510, but not magnetic toggling device 508. Namely, in FIG. 9, trajectory 902 represents the magnetic field trajectory as experienced by magnetic toggling device 510. Spin flop point 904 represents the spin flop point for both magnetic toggling device 508 and 510 since they have parallel directions of anisotropy. Trajectory 906 represents the magnetic field trajectory as experienced by magnetic toggling device 508. There is no toggling of magnetic toggling device 508, e.g., as a result of trajectory 906.

As mentioned above, the magnetic toggling devices may reside in distinct, different, levels within magnetic device 500, e.g., magnetic toggling device levels. According to an exemplary embodiment, the present magnetic device comprises exactly two magnetic toggling device levels, e.g., N=2, wherein N is the number of magnetic toggling device levels. According to another exemplary embodiment, the magnetic device comprises more than two magnetic toggling device levels, e.g., N>2. In these embodiments, the number of current carrying lines should be one greater than the number of magnetic toggling device levels, e.g., N+1. Further, the differences in potential layouts and designs based on these two exemplary embodiments can be significant and should be noted.

Figure 10:
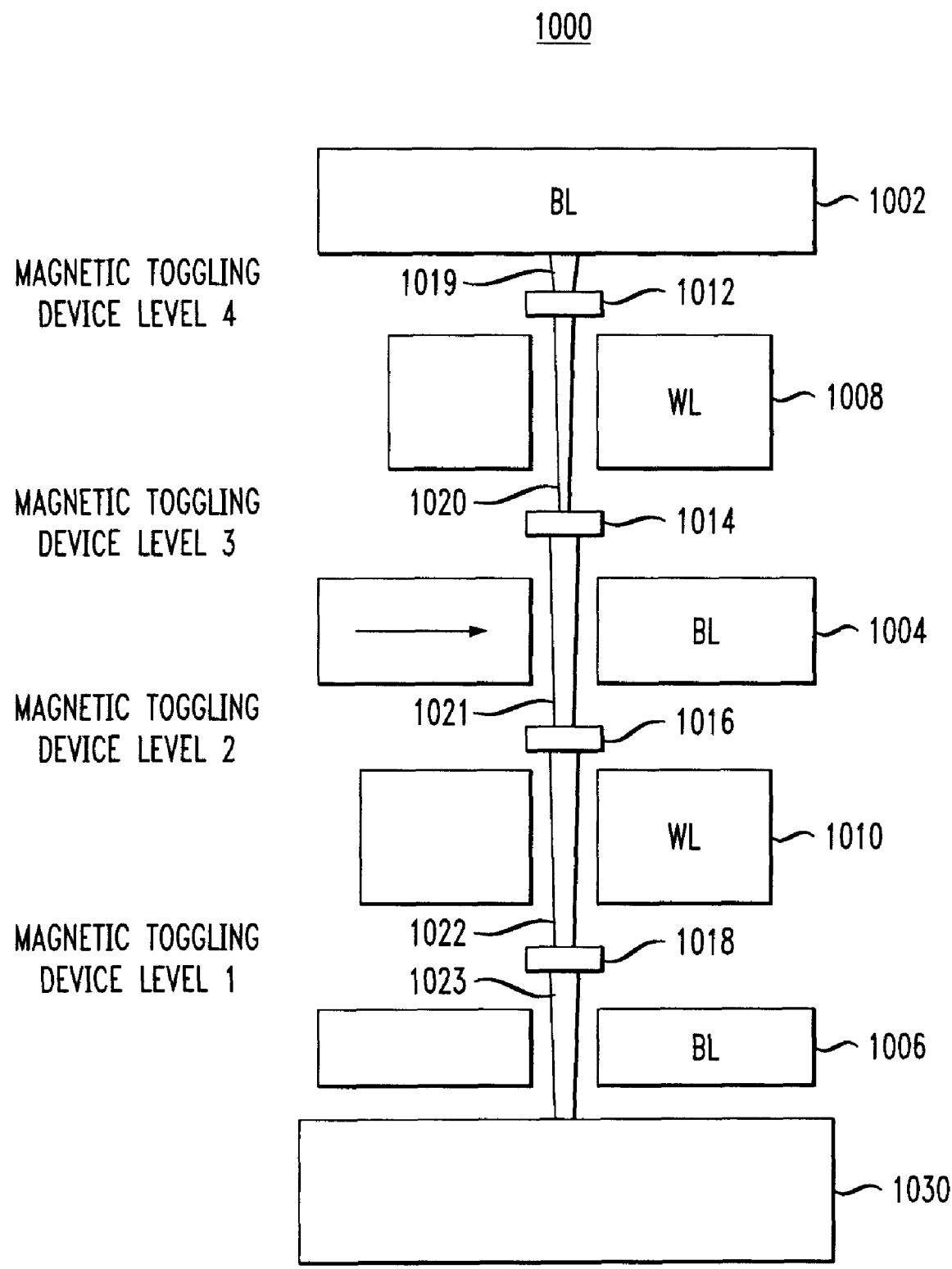
FIG. 10 is a cross-sectional view illustrating an exemplary magnetic device configuration having four stacked magnetic toggling devices according to an embodiment of the present invention.

According to an exemplary embodiment wherein magnetic device 500 comprises more than two magnetic toggling device levels, vias and split (or offset) current carrying lines are employed to stack multiple magnetic toggling devices yet use only one transistor for reading all of them. FIG. 10, for example, is a cross-sectional view illustrating an exemplary magnetic device configuration having four stacked magnetic toggling devices.

In FIG. 10, magnetic device 1000 comprises a plurality of current carrying lines, including bit lines 1002, 1004 and 1006, and word lines 1008 and 1010 oriented substantially orthogonal to the bit lines (bit lines 1004 and 1006 have been rotated 90 degrees for clarity). According to the depiction in FIG. 10 the bit lines are shown running across the width of the page, while the word lines are shown running into the plane of the page. Word lines 1008 and 1010 are split or offset to permit vias 1020 and 1022 to connect magnetic toggling devices 1012 and 1014 and magnetic toggling devices 1016 and 1018, respectively. Similarly, bit lines 1004 and 1006 are split to permit vias 1021 and 1023 to connect magnetic toggling devices 1014 and 1016, and magnetic toggling device 1018 to the drain contact of semiconductor transistor 1030. The top of the last magnetic toggling device level, in this example magnetic toggling device 1012, will be electrically connected to the last current carrying line, in this example bit line 1002 (e.g., by via 1019). In this exemplary embodiment, the vias connect the magnetic toggling device levels, e.g., magnetic toggling devices 1018, 1016, 1014 and 1012 representing magnetic toggling device levels 1, 2, 3 and 4, respectively, thus minimizing the area associated with multiple vias on any level.

In an exemplary embodiment, self-aligned vias are employed. With this particular design, magnetic device areas approximately equal to $15F^2/n$, wherein n is the number of stacking levels and F is the minimum feature size in the technology, are quite plausible. F refers to the ground rules of the design of the transistor complimentary metal oxide semiconductor (CMOS) front end. For example, if a 0.18 micron technology transistor is being used, the F=0.18 microns. Thus, F typically refers to the smallest dimension in the transistor, e.g., typically the gate length. The configuration shown illustrated in FIG. 10 is also applicable when the magnetic device comprises other numbers of MTJ devices. The bit lines and word lines can also be offset.

The configuration shown in FIG. 10 may result in a reduced read signal which must be mitigated by a higher magnetoresistance (MR) ratio and/or a slower read performance of the device. To write one of these magnetic toggling devices, e.g., magnetic toggling device 1016, electrical currents will flow on bit line 1004 and on word line 1010, the time domain sequencing of which is performed in accordance with, e.g., that described in conjunction with FIG. 3, above, to generate the appropriate magnetic fields to toggle the magnetic toggling device.

As is illustrated in, and described in conjunction with the description of, FIGS. 7 and 9, the magnetic fields generated by these two currents will not affect any of the other magnetic toggling devices, e.g., magnetic toggling devices 1012, 1014 or 1018, as the magnetic fields generated do not reside in the appropriate quadrant, e.g., either the first or third quadrant, to toggle these other magnetic toggling devices. To read all of the magnetic toggling devices, e.g., magnetic toggling devices 1012, 1014, 1016 and 1018, semiconductor transistor 1030 is activated and the top current carrying line, e.g., bit line 1002, is held at a different potential than that on the source (not shown) of semiconductor transistor 1030. This will result in an electrical sense current to flow across all of the magnetic toggling devices. The total resistance of the magnetic toggling devices can then be measured based on the magnitude of the sense current. One of several known methods may then be used to extract the magnetic states of each of the magnetic toggling devices based on the total resistance. Suitable methods include, but are not limited to, designing a different resistance change for each of the magnetic toggling devices.

Figure 11:
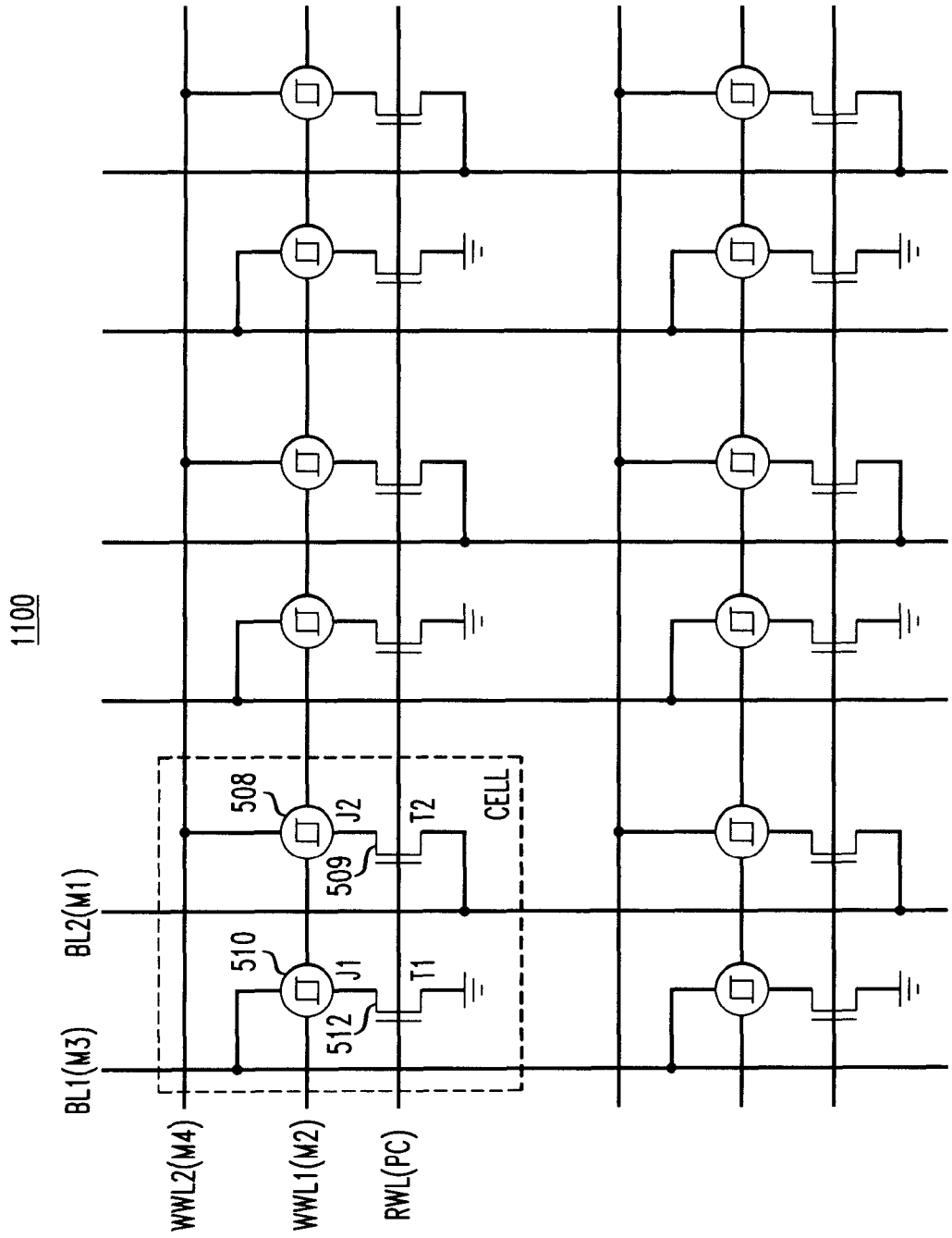
FIG. 11 is a circuit diagram illustrating an exemplary magnetic device configuration having two stacked magnetic toggling devices and two co-planar semiconductor transistors according to an embodiment of the present invention.

According to another exemplary embodiment, the present magnetic device comprises two magnetic toggling devices and two semiconductor transistors. FIG. 11, for example, is a circuit diagram illustrating an exemplary magnetic device configuration having two stacked magnetic toggling devices and two co-planar semiconductor transistors. In FIG. 11, for example, magnetic toggling device 508 (labeled "J2") and semiconductor transistor 509 (labeled "T2") are configured to be inverted, i.e., the bit line BL2(M1) is closer to semiconductor transistor 509 than to magnetic toggling device 508. In comparison, magnetic toggling device 510 (labeled "J1") is configured as a non-inverted cell, i.e., the bit line BL1(M3) is positioned between the two magnetic toggling device levels and acts as both the read bit line for magnetic toggling device 510 and for one of the two write lines for both magnetic toggling device 508 and magnetic toggling device 510.

A further advantage of the configuration shown in FIG. 11 is that having magnetic toggling device 508 and magnetic toggling device 510 on the same word line allows them to be read simultaneously. For example, to write magnetic toggling device 510 an electrical current of appropriate magnitude is flowed through WWL1 (M2) and another electrical current of appropriate magnitude is flowed through BL1(M3) the time domain sequencing of which is performed in accordance with, e.g., that described in conjunction with FIG. 3, above.

The field created by these two currents resides in the appropriate quadrant such that magnetic toggling device 510 can be written. As is illustrated in, and described in conjunction with the description of, FIGS. 7 and 9, above, the magnetic fields generated by these two currents will not affect magnetic toggling device 508.

To write magnetic toggling device 508, for example, an electrical current of appropriate magnitude is flowed through WWL2(M4) and another electrical current of appropriate magnitude is flowed through BL1(M3). As above, the time domain sequencing of the magnetic fields is performed. The direction of the two currents is such that either both current directions are identical or both current directions are opposite to what are used to write magnetic toggling device 510. The magnetic fields created by these two currents will then also reside in the appropriate quadrant to write magnetic toggling device 508 but will also not affect magnetic toggling device 510.

To read magnetic toggling devices 508 and 510, the read word line (labeled "RWL(PC)") is activated so that semiconductor transistors 509 and 512 (labeled "T1") are conductive. Further, BL1(M3) is held at a potential different than that of the ground to cause a sense current (which is typically less than the current used to write the magnetic toggling devices) to flow across magnetic toggling device 510. BL2(M1) and WWL2(M4) will be held at different potentials to cause a sense current to flow across magnetic toggling device 508. The resistance of magnetic toggling devices 508 and 510 can then be measured based on the size of the two sense currents. In comparison with the configuration shown in, and described in conjunction with the description of, FIG. 10, the configuration of FIG. 11 has the possible advantage of a higher read performance due to the separate read path for the two stacked magnetic toggling devices.

Larger write current requirements lead to larger transistors being employed for steering the currents. These large transistors, in turn, lead to reduced array efficiency (e.g., a reduction in the percentage of chip area actually used for magnetic toggling devices). For most conventional applications, each layer of stacked magnetic toggling devices requires a word line driver and a bit line driver. However, according to the present techniques, for n layers of stacked magnetic toggling devices, only n/2 word line drivers and n/2+1 bit line drivers (or vice versa) are required, since the write lines are shared for neighboring layers. For example, if n equals four, then only five drivers are needed (e.g., three bit line drivers plus two word line drivers; or three word line drivers plus two bit line drivers) in total, instead of the eight (four word line drivers plus four bit line drivers) that would be needed with a conventional system. This exemplary configuration significantly reduces the amount of chip area required, at least on a comparable level as the reduced cell footprint. An additional benefit to this configuration includes reduced chip complexity.

Figure 12:
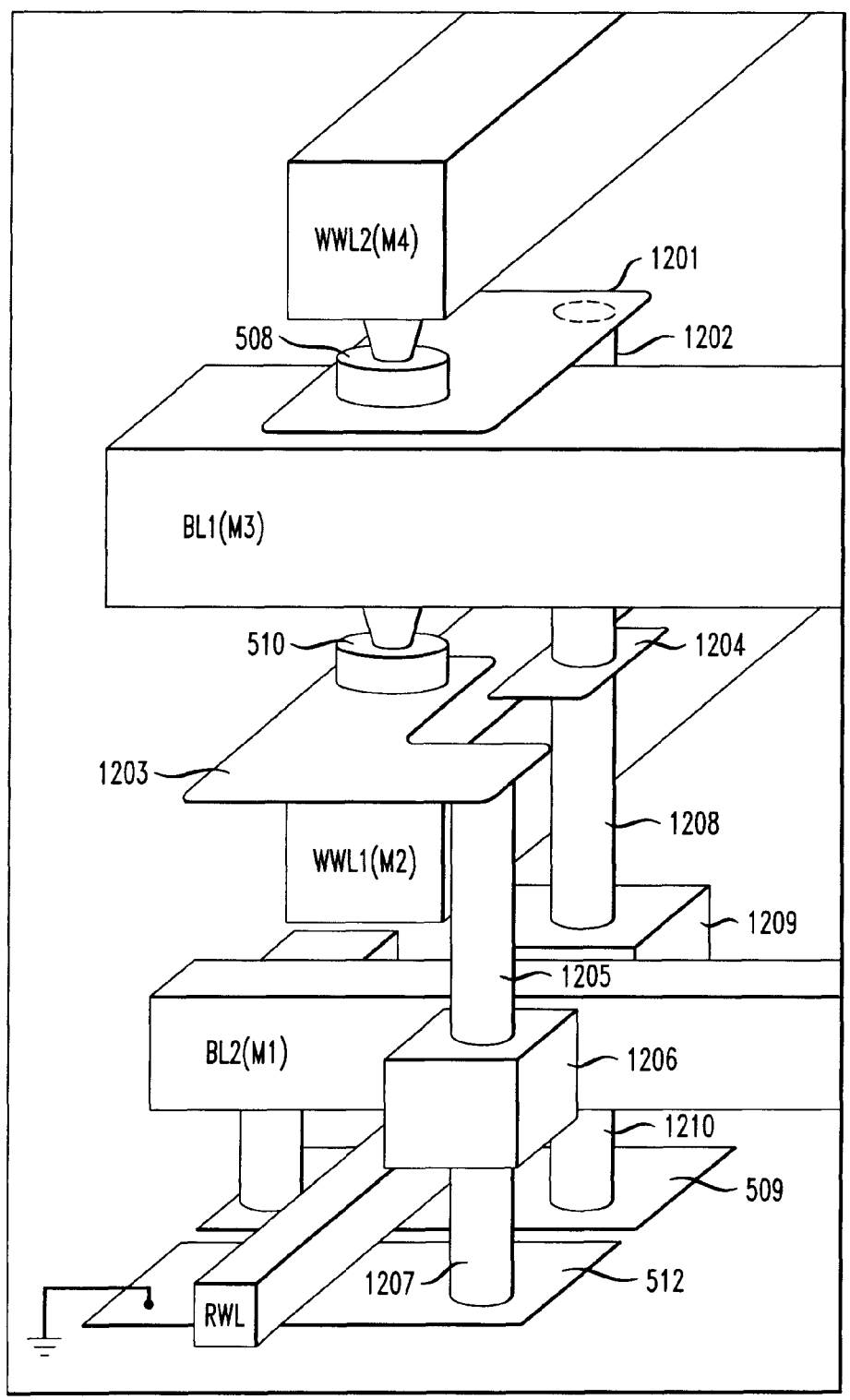
FIG. 12 is a cross-sectional view of an exemplary magnetic device configuration having two stacked magnetic toggling devices and two co-planar semiconductor transistors according to an embodiment of the present invention.

FIG. 12 is a cross-sectional view of an exemplary magnetic device configuration having two stacked magnetic toggling devices and two co-planar semiconductor transistors. As shown in FIG. 12, magnetic device 1200, e.g., an MRAM device, comprises magnetic toggling device 508 between WWL2 and BL1. One end of magnetic toggling device 508 is electrically connected to WWL2, e.g., on the fourth metal level (M4). Local interconnect 1201 electrically connects the other end of magnetic toggling device 508 to inter-level contact 1202. Inter-level contact 1202, in turn, is electrically connected to local interconnect 1204 and contacts 1208, 1209 and 1210 to electrically connect magnetic toggling device 508 with the drain of transistor 509. The source of transistor 509 is connected to BL2, e.g., on the first metal level (M1).

Magnetic device 1200 further comprises magnetic toggling device 510 between BL1 and WWL1. One end of magnetic toggling device 510 is electrically connected to BL1, e.g., on the third metal level (M3). Local interconnect 1203 and contacts 1205, 1206 and 1207 electrically connect the other end of magnetic toggling device 510 to the drain of transistor 512. The source of transistor 512 is connected to system ground. The gate of both transistors 509 and 512 is the RWL (read word line).

Figure 13:
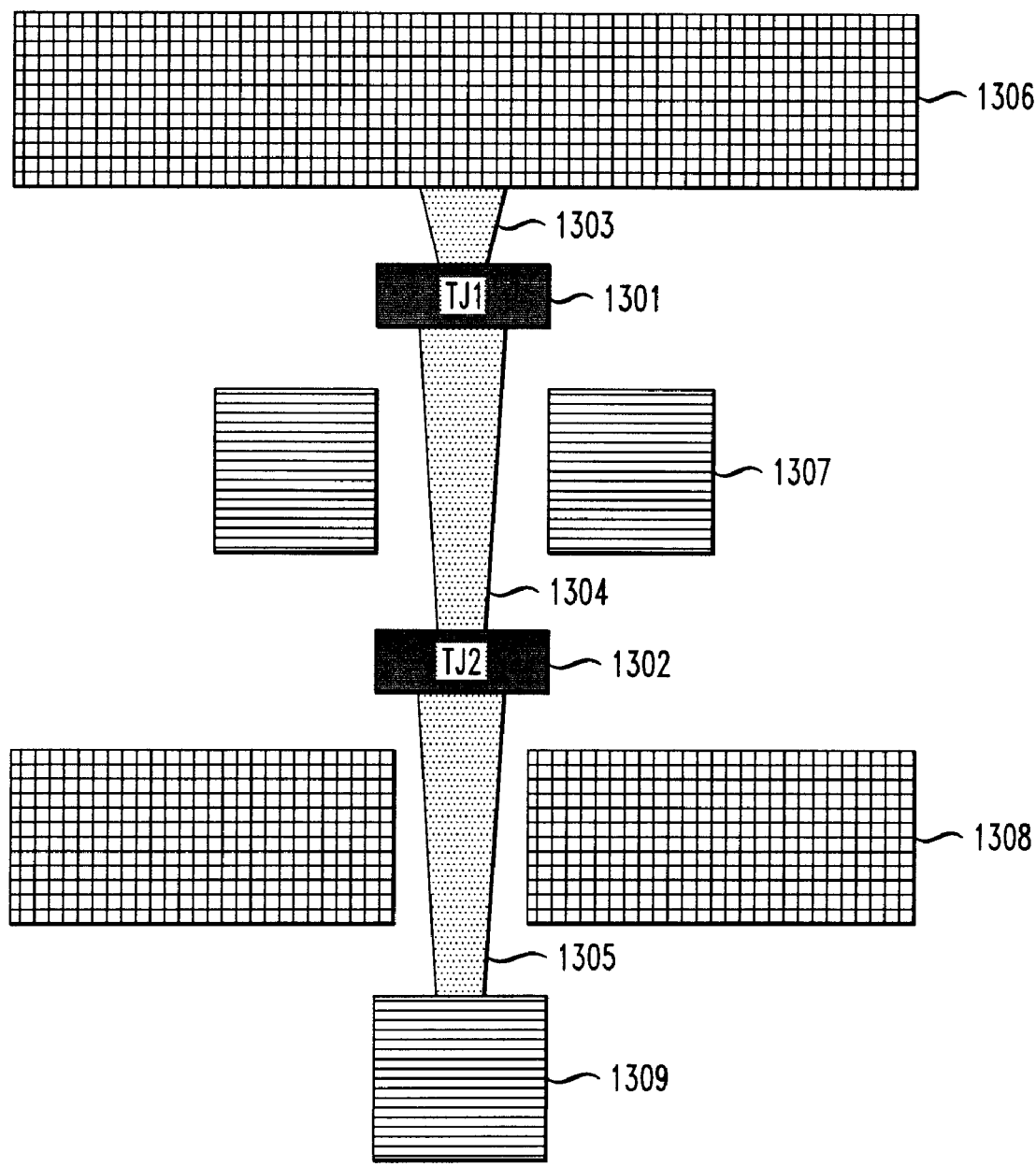
FIG. 13 is a cross-sectional view of an exemplary magnetic device configuration according to an embodiment of the present invention.

FIG. 13 is a cross-sectional view of an exemplary magnetic device configuration. In FIG. 13, magnetic device 1300 comprises magnetic toggling device 1301 (labeled "TJ1") between bit line 1306 and word line 1307. Magnetic toggling device 1301 is electrically connected to bit line 1306 and contact (via) 1304. Magnetic device 1300 further comprises magnetic toggling device 1302 (labeled "TJ2") between word line 1307 and bit line 1308 (bit line 1308 is rotated 90 degrees for clarity). Magnetic toggling device 1302 is electrically connected to contacts (vias) 1304 and 1305. Contact 1305 is electrically connected to a read word line (RWL) 1309.

Similar to bit lines 1002, 1004 and 1006, and word lines 1008 and 1010, as described above in conjunction with the description of FIG. 10, word line 1307 and bit line 1308 are split or offset. As described, e.g., in conjunction with the description of FIGS. 7-9, above, electrical currents flowing on bit line 1306 and word line 1307 can toggle the state of magnetic toggling device 1301 but cannot affect magnetic toggling device 1302. Similarly, electrical currents flowing on word line 1307 and bit line 1308 can toggle the state of magnetic toggling device 1302 but cannot affect magnetic toggling device 1301.

Reading of magnetic device 1300 may involve generating different sense-current levels for different combination of states of said magnetic toggling devices 1301 and 1302. Suitable methods for generating different sense-current levels include, but are not limited to, designing a different resistance change for magnetic toggling devices 1301 and 1302. In this embodiment, it is important to note that the bit lines and word lines are interchangeable. It is also important to note that this exemplary embodiment, as well as all the embodiments described herein, should not be limited to having any particular number of magnetic toggling devices. By way of example only, the exemplary configuration depicted in FIG. 13 may comprise greater than two stacked magnetic toggling devices.

Although illustrative embodiments of the present invention have been described herein, it is to be understood that the invention is not limited to those precise embodiments, and that various other changes and modifications may be made by one skilled in the art without departing from the scope or spirit of the invention.

What is claimed is:

1. A magnetic device comprising:
a plurality of current carrying lines; and
two or more adjacent stacked magnetic toggling devices sharing at least one of the plurality of current carrying lines in common and positioned therebetween, wherein the two or more adjacent stacked magnetic toggling devices have substantially similar orientations, wherein magnetic fields of each of the two or more adjacent stacked magnetic toggling devices are in different quadrants, wherein at least one of the two or more adjacent magnetic toggling devices is configured to maintain a current state whenever another of the two or more adjacent magnetic toggling devices performs a toggle, and wherein at least a portion of at least one side of a first one of said magnetic toggling devices overlaps at least a portion of at least one side of another of said magnetic toggling devices.

2. The device of claim 1, comprising a magnetic random access memory device.

3. The device of claim 1, wherein at least one of the magnetic toggling devices comprises a magnetic tunnel junction.

4. The device of claim 1, comprising a plurality of levels and wherein each of the two or more adjacent stacked magnetic toggling devices resides in a different one of the plurality of levels from each other.

5. The device of claim 4, comprising N+1 current carrying lines, wherein N is a number of levels in the device.

6. The device of claim 1, wherein at least one of the magnetic toggling devices has at least one free magnetic layer separated from at least one pinned magnetic layer by at least one barrier layer.

7. The device of claim 6, wherein a given one of the at least one free magnetic layer comprises two or more magnetic layers anti-parallel coupled by at least one non-magnetic spacer layer positioned therebetween.

8. The device of claim 6, wherein a given one of the at least one free magnetic layer comprises two or more ferromagnetic layers anti-parallel coupled by at least one non-magnetic spacer layer positioned therebetween.

9. The device of claim 7, wherein the non-magnetic spacer layer comprises ruthenium.

10. The device of claim 7, wherein the non-magnetic spacer layer has a thickness of between about 50 angstroms to about 60 angstroms.

11. The device of claim 1, comprising two magnetic toggling devices disposed in a stacked arrangement relative to one another.

12. The device of claim 1, comprising greater than two magnetic toggling devices disposed in a stacked arrangement relative to one another.

13. The device of claim 1, wherein at least one of the plurality of current carrying lines is oriented orthogonal to one or more other of the plurality of current carrying lines.

14. The device of claim 1, wherein the two or more adjacent stacked magnetic toggling devices have axes of anisotropy that are substantially parallel to each other.

15. A magnetic device comprising:
a plurality of current carrying lines; and
two or more adjacent stacked magnetic toggling devices sharing at least one of the plurality of current carrying lines in common and positioned therebetween, wherein the two or more adjacent stacked magnetic toggling devices have substantially similar orientations, wherein magnetic fields of each of the two or more adjacent stacked magnetic toggling devices are in different quadrants, wherein one or more of the magnetic toggling devices comprises at least one free magnetic layer separated from at least one pinned magnetic layer by at least one barrier layer, the at least one free magnetic layer comprising two or more magnetic layers anti-parallel coupled by at least one non-magnetic spacer layer positioned therebetween so as to maintain a current state whenever another of the adjacent magnetic toggling devices performs a toggle, wherein at least a portion of at least one side of a first one of said magnetic toggling devices overlaps at least a portion of at least one side of another of said magnetic toggling devices.

16. A method of toggling a magnetic device comprising a plurality of current carrying lines and two or more adjacent stacked magnetic toggling devices sharing at least one of the plurality of current carrying lines in common and positioned therebetween, wherein the two or more adjacent stacked magnetic toggling devices have substantially similar orientations, wherein magnetic fields of each of the two or more adjacent stacked magnetic toggling devices are in different quadrants, and wherein at least a portion of at least one side of a first one of said magnetic toggling devices overlaps at least a portion of at least one side of another of said magnetic toggling devices, the method comprising the step of:
passing current through one or more of the current carrying lines to generate a magnetic field sufficient to toggle at least one of the two or more adjacent magnetic toggling devices and to maintain a current state of another of the two or more adjacent magnetic toggling devices whenever said at least one of the two or more adjacent magnetic toggling devices performs a toggle.

17. The method of claim 16, wherein the magnetic device further comprises a plurality of levels and wherein each of the two or more adjacent stacked magnetic toggling devices resides in a different one of the plurality of levels from each other.

18. The device of claim 17, comprising N+1 current carrying lines, wherein N is a number of levels in the device.

19. The method of claim 16, wherein the magnetic device comprises two magnetic toggling devices disposed in a stacked arrangement relative to one another.

20. The method of claim 16, wherein the magnetic device comprises greater than two magnetic toggling devices disposed in a stacked arrangement relative to one another.

21. An integrated circuit including at least one magnetic device comprising:
 a plurality of current carrying lines; and
 two or more adjacent stacked magnetic toggling devices sharing at least one of the plurality of current carrying lines in common and positioned therebetween, wherein the two or more adjacent stacked magnetic toggling devices have substantially similar orientations, wherein magnetic fields of each of the two or more adjacent stacked magnetic toggling devices are in different quadrants, the magnetic device being configured such that at least one of the two or more adjacent magnetic toggling devices maintains a current state whenever another of the two or more adjacent magnetic toggling devices performs a toggle, wherein at least a portion of at least one side of a first one of said magnetic toggling devices overlaps at least a portion of at least one side of another of said magnetic toggling devices.

22. A magnetic random access memory device, comprising a plurality of magnetic devices configured in an array, at least one of the plurality of magnetic devices comprising:
 a plurality of current carrying lines; and
 two or more adjacent stacked magnetic toggling devices sharing at least one of the plurality of current carrying lines in common and positioned therebetween, wherein the two or more adjacent stacked magnetic toggling devices have substantially similar orientations, wherein magnetic fields of each of the two or more adjacent stacked magnetic toggling devices are in different quadrants, the magnetic device being configured such that at least one of the two or more adjacent magnetic toggling devices maintains a current state whenever another of the two or more adjacent magnetic toggling devices performs a toggle, wherein at least a portion of at least one side of a first one of said magnetic toggling devices overlaps at least a portion of at least one side of another of said magnetic toggling devices.

* * * * *